United States Patent
Egami et al.

(10) Patent No.: US 11,492,513 B2
(45) Date of Patent: Nov. 8, 2022

(54) DISPERSION LIQUID OF SILICA PARTICLES, POLISHING COMPOSITION, AND METHOD FOR PRODUCING DISPERSION LIQUID OF SILICA PARTICLES

(71) Applicant: JGC CATALYSTS AND CHEMICALS LTD., Kanagawa (JP)

(72) Inventors: Miki Egami, Fukuoka (JP); Mitsuaki Kumazawa, Fukuoka (JP); Ryo Muraguchi, Fukuoka (JP); Michio Komatsu, Fukuoka (JP)

(73) Assignee: JGC CATALYSTS AND CHEMICALS LTD., Kanagawa (JP)

( * ) Notice: Subject to any disclaimer, the term of this patent is extended or adjusted under 35 U.S.C. 154(b) by 25 days.

(21) Appl. No.: 17/040,779

(22) PCT Filed: Mar. 28, 2019

(86) PCT No.: PCT/JP2019/013678
§ 371 (c)(1),
(2) Date: Sep. 23, 2020

(87) PCT Pub. No.: WO2019/189610
PCT Pub. Date: Oct. 3, 2019

(65) Prior Publication Data
US 2021/0002513 A1    Jan. 7, 2021

(30) Foreign Application Priority Data
Mar. 30, 2018 (JP) .............................. JP2018-070294

(51) Int. Cl.
*C09G 1/02* (2006.01)
*C09K 3/14* (2006.01)
(Continued)

(52) U.S. Cl.
CPC .............. *C09G 1/02* (2013.01); *C01B 33/141* (2013.01); *C09K 3/1409* (2013.01);
(Continued)

(58) Field of Classification Search
CPC ... B24B 37/00; C01B 33/141; C01P 2004/50; C01P 2004/61; C01P 2004/62;
(Continued)

(56) References Cited

U.S. PATENT DOCUMENTS

2007/0237701 A1    10/2007   Yamakawa et al.
2010/0071272 A1    3/2010    Higuchi
(Continued)

FOREIGN PATENT DOCUMENTS

JP    2005-060217 A    3/2005
JP    2005-060219 A    3/2005
(Continued)

OTHER PUBLICATIONS

ISR for PCT/JP2019/013678, dated Jul. 2, 2019.

*Primary Examiner* — Shuangyi Abu Ali
(74) *Attorney, Agent, or Firm* — Greenblum & Bernstein, P.L.C.

(57) ABSTRACT

A polishing composition that can not only achieve high polishing speed, but also can improve the surface smoothness (surface quality) of a polished substrate and reduce defects is provided. That is, provided is a polishing composition comprising silica particles and a water soluble polymer, wherein the contained silica particles satisfy the following requirements (a) to (c): (a) the primary particle diameter based on the specific surface area is 5 to 300 nm; (b) the coefficient of variation in the particle diameter is 10% or less; and (c) the Sears number Y is 10.0 to 12.0.

4 Claims, 1 Drawing Sheet

(51) Int. Cl.
*C01B 33/141* (2006.01)
*H01L 21/321* (2006.01)
*H01L 21/768* (2006.01)

(52) U.S. Cl.
CPC ...... *C01P 2004/50* (2013.01); *C01P 2004/61* (2013.01); *C01P 2004/62* (2013.01); *C01P 2004/64* (2013.01); *C01P 2006/10* (2013.01); *C01P 2006/12* (2013.01); *C01P 2006/90* (2013.01); *H01L 21/3212* (2013.01); *H01L 21/7684* (2013.01)

(58) Field of Classification Search
CPC .............. C01P 2004/64; C01P 2006/10; C01P 2006/12; C01P 2006/90; C09G 1/02; C09K 3/1409; C09K 3/1463; H01L 21/02024; H01L 21/3212; H01L 21/7684
See application file for complete search history.

(56) References Cited

U.S. PATENT DOCUMENTS

| | | |
|---|---|---|
| 2011/0315912 A1 | 12/2011 | Menzel et al. |
| 2012/0094491 A1 | 4/2012 | Kanamaru et al. |
| 2014/0319411 A1* | 10/2014 | Sakaida ............... C09K 3/1463 252/79.1 |
| 2014/0363973 A1 | 12/2014 | Kanamaru et al. |
| 2016/0177155 A1* | 6/2016 | Nakamura ............ C09G 1/02 252/79.1 |
| 2018/0258320 A1 | 9/2018 | Yoshizaki et al. |
| 2019/0077993 A1 | 3/2019 | Park et al. |

FOREIGN PATENT DOCUMENTS

| | | |
|---|---|---|
| JP | WO 2008/123373 A1 | 10/2008 |
| JP | 2010-028078 A | 2/2010 |
| JP | WO 2011/021599 A1 | 2/2011 |
| JP | 2012-518127 A | 8/2012 |
| JP | 2013-082584 A | 5/2013 |
| JP | 2014-022511 A | 2/2014 |
| JP | 2014-140056 A | 7/2014 |
| JP | WO 2017/057478 A1 | 4/2017 |
| WO | WO 2014/007063 A1 | 1/2014 |
| WO | WO 2017/200297 A1 | 11/2017 |
| WO | WO-2017200297 A1 * | 11/2017 ........... H01L 21/304 |

* cited by examiner

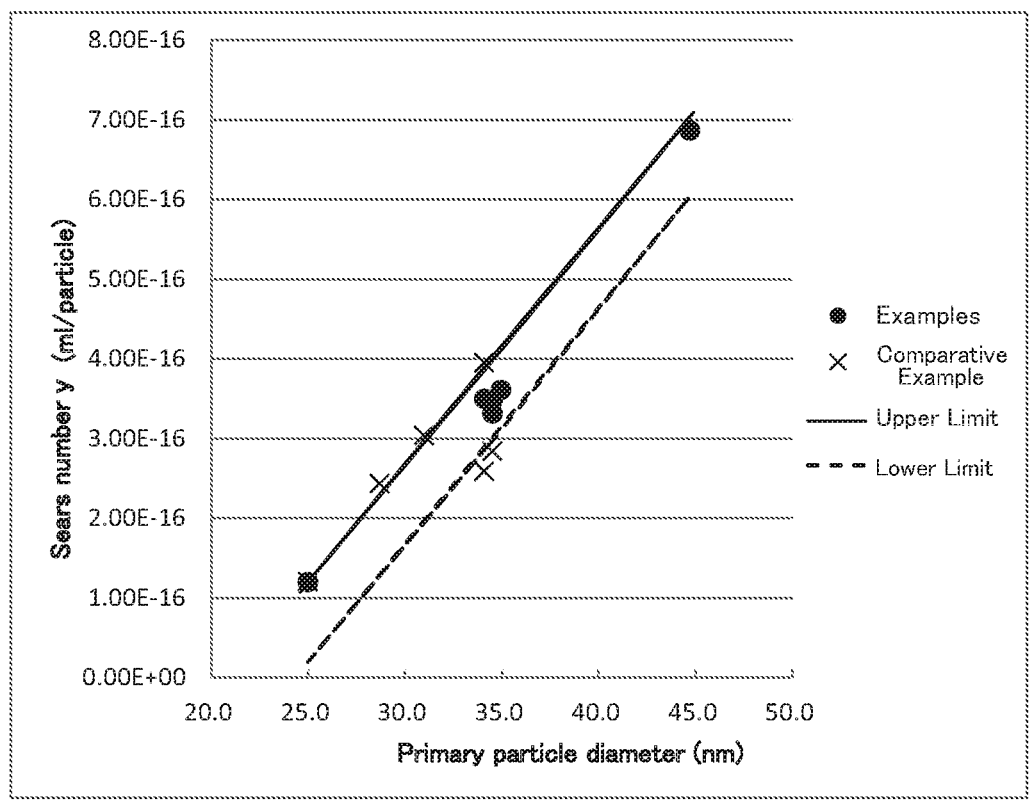

DISPERSION LIQUID OF SILICA PARTICLES, POLISHING COMPOSITION, AND METHOD FOR PRODUCING DISPERSION LIQUID OF SILICA PARTICLES

TECHNICAL FIELD

The present invention relates to a dispersion liquid of silica particles and a polishing composition using the same. This dispersion liquid is useful as a material for a polishing composition in substrate formation or the like of metal wiring layers in semiconductor integrated circuits.

BACKGROUND ART

Silica particles used for polishing silicon wafers and the like are required to have a high purity. For example, Patent Literatures 1 and 2 disclose highly-pure colloidal silicas with a low content of metal impurities, obtained by hydrolyzing an alkyl silicate.

Also, for example, Patent Literatures 3 to 5 disclose the use of compact silica particles with reduced residual silanol groups as polishing compositions.

In case of obtaining a dispersion liquid containing such silica particles to be used for polishing, in general, a method is employed in which an alkoxysilane is hydrolyzed and polycondensed using an alkali catalyst such as ammonia, and the solvent and the by-product, an alcohol, are removed and replaced with water (see, for example, Patent Literatures 6 and 7).

CITATION LIST

Patent Literature

[Patent Literature 1]
Re-publication of PCT International Publication No. 2008/123373
[Patent Literature 2]
Japanese Patent Laid-Open Publication No. 2013-082584
[Patent Literature 3]
Japanese Patent Laid-Open Publication No. 2010-028078
[Patent Literature 4]
Re-publication of PCT International Publication No. 2011/021599
[Patent Literature 5]
Re-publication of PCT International Publication No. 2017/057478
[Patent Literature 6]
Japanese Patent Laid-Open Publication No. 2005-060217
[Patent Literature 7]
Japanese Patent Laid-Open Publication No. 2005-060219

SUMMARY OF INVENTION

Technical Problem

The silica particles of Patent Literatures 1 and 2 have a coefficient of variation in the particle diameter (CV value) of more than 10, and a wide particle size distribution. Therefore, uniform polishing cannot be performed with a polishing composition using these silica particles. In addition, the dispersion liquids of Patent Literatures 3 to 5 have a low silanol group density on the surface of silica particles, so that interaction with an additive hardly occurs and the polishing speed is slow. Moreover, in a polishing composition of Literatures 6 and 7, since compaction of silica particles is not proceeded sufficiently, the polishing speed is slow and the state of a polished surface is insufficient.

Accordingly, there has been a demand for a polishing composition that can not only achieve high polishing speed, but also improves the surface smoothness (surface quality) of a polished substrate and reduce defects.

Solution to Problem

In a polishing composition, silica particles (abrasive grains) and a water soluble polymer are contained. The water soluble polymer is adsorbed onto the surface of a substrate, and while protecting the surface to be polished from corrosion by a basic compound, it enables uniform polishing. At the time of polishing, it is considered that the water soluble polymer at a part where the abrasive grains are pressed against comes off, and the surface to be polished directly under that part is polished. In addition, the water soluble polymer imparts hydrophilicity to the surface of the substrate after polishing, thereby improving washability.

Furthermore, it is considered that water soluble polymers that are not adsorbed onto the surface to be polished, stabilize dispersion due to slow aggregation by being adsorbed onto the surface of the abrasive grains, and are also adsorbed onto the surface of polishing dust, preventing re-adsorption onto the substrate and reducing defects.

The present inventors focused on the relationship between the silica particles as abrasive grains and the water soluble polymer added to the polishing composition in order to achieve the objects in a trade-off relationship, that are high polishing speed and formation of a good polished surface (improvement in surface smoothness and reduction of defects).

First, silica particles having a narrow particle size distribution and a small particle diameter were used in the polishing composition. As a result, improvement in the smoothness of the polished substrate and reduction of defects were achieved, but the polishing speed could not be improved. However, it was found that even such small spherical silica particles can be made into aggregates by controlling the particle surface state (controlling the amount of OH groups (silanol groups)) and planning optimization of the interaction with the water soluble polymer contained in the polishing composition.

These aggregates are moderately bigger than the silica particles, thereby achieving high polishing speed. On the other hand, since the bonding force of particles in these aggregates is relatively weak, they are readily collapsed when a strong force acts on these aggregates during polishing. Therefore, the smoothness of the polished substrate can be secured and the occurrence of defects can be suppressed. In particular, large particles are more effective in reducing defects due to polishing steps.

Up to now, aggregates of particles have been considered to be a cause of substrate surface defects called "Light Point Defect (LPD)" and a cause of deteriorating the filterability of the polishing composition, and measures have been taken to eliminate them. However, it was found that silica particles that meet certain requirements form controlled aggregates in the polishing composition, which can achieve improvement in the polishing speed and formation of a good polished surface at the same time.

As described above, for silica particles to be used in the polishing composition, the amount of OH groups on the surface thereof is important. Therefore, it was decided to adjust the amount of OH groups in silica particles by heating a dispersion liquid containing the silica particles at a pH of 7 or higher, and then to concentrate the dispersion liquid of silica particles under a condition where this amount of OH groups is not changed. As a result of this, a dispersion liquid having a high concentration of silica particles containing a desired amount of OH groups can be obtained.

That is, the silica particles according to the present invention satisfy the following requirements (a) to (c):

(a) a primary particle diameter calculated based on the specific surface area determined by a BET method using nitrogen adsorption is 5 to 300 nm;

(b) a coefficient of variation in the particle diameter is 10% or less; and (c) a Sears number Y is 10.0 to 12.0.

In addition, the polishing composition of the present invention comprises silica particles and a water soluble polymer.

Moreover, a production method of the present invention comprises: a particle formation step of hydrolyzing and polycondensing an alkoxysilane to form silica particles, the silica particles having a primary particle diameter calculated based on the specific surface area of 5 to 300 nm and a coefficient of variation in the particle diameter of 10% or less; a particle surface adjustment step of heating a dispersion liquid of silica particles obtained in the particle formation step at a pH of 7 or higher to adjust the Sears number Y of the silica particles to 10.0 to 12.0; and a concentration step of concentrating the dispersion liquid of silica particles obtained in the particle surface adjustment step at a pH of lower than 7.

Advantageous Effects of Invention

High polishing speed and formation of a good polished surface (improvement in surface smoothness and reduction of defects) can be achieved.

BRIEF DESCRIPTION OF DRAWING

FIG. 1 shows the relationship between the average primary particle diameter and a Sears number y of silica particles produced in Synthesis Examples and Synthesis Comparative Examples.

DESCRIPTION OF EMBODIMENTS

[Dispersion Liquid of Silica Particles]

In a dispersion liquid of silica particles of the present invention, the silica particles satisfy the following requirements (a) to (c):

(a) the primary particle diameter calculated based on the specific surface area determined by a BET method using nitrogen adsorption is 5 to 300 nm;

(b) the coefficient of variation in the particle diameter (CV value) is 10% or less; and (c) the Sears number Y is 10.0 to 12.0.

These silica particles are silica particles having a narrow particle size distribution and a small particle diameter. If they are used as a polishing composition, when the particles come into contact with a substrate as abrasive grains, they come into contact with the substrate evenly and roll. Therefore, the particles themselves do not cause defects during polishing.

In addition, since these particles satisfy the requirement (c) described above, they form aggregates by a weak bond due to the interaction with a water soluble polymer. Therefore, the mechanical polishing power is improved, the steps are easily smoothed, and the surface quality is improved. As such, the polishing composition according to the present invention can not only achieve high polishing speed, but also provide the polished surface with good surface quality. Furthermore, when an excessive force is applied, the aggregates are readily collapsed, and defects of the polished surface are suppressed.

The silica particles have a primary particle diameter calculated based on the specific surface area of 5 to 300 nm. Note that the specific surface area (SA $[m^2/g]$) is determined by a BET method using nitrogen adsorption. When the primary particle diameter is less than 5 nm, the stability of the dispersion liquid becomes insufficient. In addition, since the primary particle diameter is too small, sufficient polishing speed cannot be obtained as a polishing composition. On the contrary, when the primary particle diameter is greater than 300 nm, scratches occur on the polished substrate and desired smoothness cannot be obtained. This primary particle diameter is preferably 5 to 100 nm, more preferably 10 to 80 nm, further preferably 20 to 60 nm, particularly preferably 25 to 45 nm, and most preferably 25 to 35 nm.

In addition, the coefficient of variation in the particle diameter (CV value) of these silica particles is 10% or less. When the CV value is greater than 10%, scratches occur on the polished substrate and desired smoothness cannot be obtained. When silica particles of a polishing composition have a uniform particle diameter, improvement in the smoothness of the polished surface and suppression of occurrence of defects can be achieved. For this reason, the CV value is preferably 8% or less and more preferably 6% or less.

Moreover, these silica particles have the Sears number Y of 10.0 to 12.0. Here, the Sears number is an index showing the amount of OH groups (silanol groups) in the silica particles. When the Sears number Y is less than 10.0, the amount of OH groups present in the particles is small, and when the particles are contained in a polishing composition, the interaction with the water soluble polymer will be small. As such, desired aggregates are not formed. On the contrary, when the Sears number Y is greater than 12.0, the amount of OH groups present in the particles is large, and when the particles are contained in the polishing composition, the interaction with the water soluble polymer will be big. Therefore, the formed aggregates are not readily collapsed during polishing, scratches occur on the polished substrate, and desired smoothness cannot be obtained. The Sears number Y is preferably 10.2 to 11.8 and more preferably 10.5 to 11.5.

The Sears number Y is measured by titration of sodium hydroxide in accordance with the description in Sears, Analytical Chemistry 28 (1956), 12, 1981-1983. According to this measurement method, the amount of OH groups on the particle surface (outside the pores) is measured.

Specifically, to 150 g of a solution of silica particles diluted with pure water such that the concentration of silica particles is 1% by mass, 30 g of sodium chloride is added. After adjusting the pH to 4.0 with hydrochloric acid, the solution is titrated with a 0.1 N aqueous sodium hydroxide solution and the Sears number Y is expressed as the amount required to reach a pH of 9.0.

That is, the Sears number Y is a titration amount of a 0.1 N aqueous NaOH solution necessary for 1.5 g of silica. It can be said that this Sears number Y takes into consideration the behavior of the entire silica particles contained in the polishing composition.

In addition to this behavior of the entire silica particles, when the function as polishing abrasive grains is further considered, the behavior of an individual particle, such as (1) the interaction with the substrate surface, (2) the interaction with the water soluble polymer, and (3) the interaction between abrasive grains, is also important. Considering the importance of this behavior per particle, it is preferable that the Sears number y calculated per particle is within a certain range.

Therefore, the Sears number y calculated per particle will be determined. Here, the silica particles are assumed to be true spheres, and the density of silica is defined as 2.20 g/cm$^3$.

The volume of 1.5 g of silica is (1.5/2.20) cm$^3$, and the volume per silica particle is expressed as $V=(4/3)\Pi(d/2)^3$ (where $\Pi$ is the circular constant, and d [nm] is the primary particle diameter of the silica particles calculated based on the specific surface area (SA [m$^2$/g]) determined by a BET method using nitrogen adsorption, that is, d=2727/SA).

Therefore, the number (P) of silica particles in 1.5 g of silica is expressed as follows:

$$P=(1.5/2.20)\times(1/V)\times(10^7)^3=(1.5/2.20)\times(6/(\pi d^3))\times(10^{21}).$$

Therefore, the Sears number y calculated per particle is determined from the Sears number Y and the primary particle diameter d, as follows:

$$y=Y/P=Y\times(2.20\times\Pi d^3)/(1.5\times 6)\times 10^{-21} \quad \text{[formula 1]}.$$

Here, the relationship between y and d determined according to [formula 1] from the measured Y and SA was plotted on a graph, and this was expressed as an approximate formula. It was found that good polishing properties can be obtained when y is within the range of this approximate formula [formula 2].

$$y=(2.92\times 10^{-17}\times d-6.60\times 10^{-16})\pm 5\times 10^{-17} \quad \text{[formula 2]}$$

That is, $(2.92\times 10^{-17}\times d-7.10\times 10^{-16})\leq y\leq(2.92\times 10^{-17}\times d-6.10\times 10^{-16})$ is satisfied.

When the Sears number y is smaller than this range, there is a risk that desired polishing speed is not obtained. On the contrary, when the Sears number y is greater than this range, there is a tendency that the surface quality (smoothness) is worsened. This Sears number y is more preferably within the range of $(2.92\times 10^{-17}\times x-6.60\times 10^{-16})\pm 3\times 10^{-17}$, further preferably within the range of $(2.92\times 10^{-17}\times x-6.60\times 10^{-16})\pm 1.8\times 10^{-17}$, and particularly preferably within the range of $(2.92\times 10^{-17}\times x-6.60\times 10^{-16})\pm 1\times 10^{-17}$.

In addition, the silica particles preferably have a density by a liquid phase substitution method (pycnometer method) of 1.80 g/cm$^3$ or more. When the density is 1.80 g/cm$^3$ or more, higher polishing speed can be obtained. The density is more preferably 1.85 g/cm$^3$ or more. The upper limit thereof is preferably, by considering occurrence of defects on the polished substrate, about 2.00 g/cm$^3$.

Moreover, the sphericity of the silica particles is preferably 0.80 to 1.00. When the shape of the silica particles is a true sphere or closer to a true sphere, the smoothness of the polished surface is improved and the occurrence of defects can be suppressed. Therefore, the sphericity is more preferably 0.90 to 1.00 and particularly preferably 1.00.

The dispersion liquid according to the present invention may not contain linked particles in which two or more silica particles are linked. This is because the silica particles form aggregates in the polishing composition and behave on the substrate in the same manner as the linked particles, as will be mentioned in the following.

However, particles in which two silica particles are linked have a small influence on the surface of the polished substrate and can be expected to improve the polishing speed, and therefore, it is preferable that such particles are contained in an amount of 10% or more of the total number of silica particles. Such linked particles tend to be horizontally placed such that the linked particles come into contact with the polished substrate when the aggregates are collapsed during polishing. Therefore, defects are less likely to occur on the polished substrate, and since the contact area with the polished substrate is increased, the polishing speed is improved. The content of these linked particles is more preferably 20% or more.

Also, in the silica particles, it is preferable that the contents of each of alkali metals, alkali earth metals, Fe, Ti, Zn, Pd, Ag, Mn, Co, Mo, Sn, Al and Zr are less than 0.1 ppm; that the amounts of each of Cu, Ni, Cr are less than 1 ppb; and that the amounts of each of U and Th are less than 0.3 ppb. These metal elements are impurities, and it is thus preferable that they are not contained in the dispersion liquid. In the case of an abrasive using a dispersion liquid containing these elements in larger amounts compared to the above amounts, the elements may remain on the substrate. In such a case, the impedance of the metal wiring may be increased, leading to delay of the responsivity, increase of the power consumption, and so on. In addition, ions of these elements may migrate (diffuse), and failures as mentioned above may occur under severe working conditions or after long-term use. In particular, U and Th generate radiation, and therefore, even when a minute amount of U or Th is remained, malfunctions of the semiconductor are caused. Note that the alkali metals refer to Li, Na, K, Rb, Cs and Fr. The alkali earth metals refer to Be, Mg, Ca, Sr, Ba and Ra.

The concentration of silica particles in the dispersion liquid is, for example, 12% by mass or more, preferably 15% by mass or more, and more preferably 20% by mass or more. The upper limit of the concentration of silica particles is not particularly limited, and is, for example, 40% by mass.

It is preferable that the amount of a "compound containing silicon" other than the silica particles present in the dispersion liquid is 200 ppm or less. The smaller the amount of this "compound containing silicon", the more the deposits on the substrate can be suppressed. In addition, it is suppressed that a variety of chemicals added to an abrasive are adsorbed onto or allowed to react with the "compound containing silicon", and thus, the effects of a variety of chemicals can be exhibited.

Note that the "compound containing silicon" includes those whose reaction has not progressed to the silica particles intended to be produced. Examples thereof include an unreacted raw material alkoxysilane and its hydrolyzates having a low molecular weight (oligomers or microgels).

It is preferable that the dispersion liquid has a viscosity (in terms of a silica particle concentration of 20% by mass) of 40 mPa·s or less. In general, the higher the purity is and/or the higher the concentration is, the higher the viscosity of the dispersion liquid becomes. However, despite its high purity, this dispersion liquid has a low viscosity even at a high concentration of 20% by mass and exhibits Newtonian properties. As such, when the dispersion liquid has a low viscosity, it is well dispersed in an abrasive (polishing composition) and can be easily processed. In addition, in general, when the concentration is lowered, the viscosity is also lowered, but since the bulk of the dispersion liquid becomes large, transportation costs or installation of storage tanks and the like will be incurred. In contrast, the dispersion liquid of the present invention has a low viscosity and a high concentration, and thus has an effect of reducing these costs.

This viscosity is more preferably 35 mPa·s or less, further preferably 30 mPa·s or less, and particularly preferably 20 mPa·s or less.

[Polishing Composition (Abrasive)]

A polishing composition of the present invention comprises silica particles and a water soluble polymer(s). These silica particles satisfy the requirements for the silica particles in the dispersion liquid mentioned above.

These silica particles become aggregates (secondary particles) in the polishing composition by interaction with the water soluble polymer. The average particle diameter of those aggregates (average aggregated particle diameter) is preferably 10 to 1000 nm. When the average aggregated particle diameter is within this range, high polishing speed and good polished surface can be achieved. This average aggregated particle diameter is more preferably 10 to 300 nm and further preferably 50 to 250 nm.

The concentration of silica particles is preferably 0.1 to 50% by mass. When the concentration of silica particles is less than 0.1% by mass, depending on the type of substrate or insulating film, the polishing speed may be slow. On the other hand, when the concentration of silica particles exceeds 50% by mass, the stability of the polishing composition becomes insufficient, and there is no further enhancement in the polishing speed and polishing efficiency. In addition, in a step of supplying the dispersion liquid for the polishing treatment, a dry matter may be formed and deposited on to the substrate, which may cause occurrence of scratches. The concentration of silica particles is more preferably 0.2 to 30% by mass.

Examples of the water soluble polymer include a water soluble cellulose, a water soluble vinyl polymer, and a polyhydric alcohol polymer. Specific examples of the water soluble cellulose include hydroxymethyl cellulose, hydroxyethyl cellulose, hydroxypropyl cellulose, carboxymethyl cellulose, hydroxyethyl methyl cellulose, hydroxypropyl methyl cellulose, methyl cellulose, ethyl cellulose, ethyl hydroxyethyl cellulose, and carboxymethyl ethyl cellulose. Further, examples of the water soluble vinyl polymer include polyvinyl alcohol, polyvinyl pyrrolidone and carboxy vinyl polymer. Among the above, hydroxyethyl cellulose and polyvinyl pyrrolidone are preferable. Examples of the polyhydric alcohol polymer include polyvinyl alcohol, poly(2-propenol), poly(ethylene-1,2-diol), poly(propylene-1,2-diol), poly(propylene-1,3-diol), poly(butadiene-1,4-diol), poly(butadiene-1,3-diol), and poly(butadiene-2,3-diol). They may be used alone or may be used in combination of multiple kinds.

The content of the water soluble polymer is preferably 0.001 to 10% by mass based on the total amount of the polishing composition. (The optimal range varies depending on the type of water soluble polymer compound.) In addition, the above amount is preferably 0.01 to 80% by mass based on the silica particles.

When the content of the water soluble polymer is within this range, exchange of the polishing composition in the polishing pad is performed more smoothly, and high polishing speed and formation of a good polished surface are more readily achieved. Moreover, moderate aggregates can be formed by moderate interaction with OH groups of the silica particles. The content of this water soluble polymer is more preferably 0.001 to 3% by mass based on the total amount of the polishing composition. Further, the above amount is more preferably 0.1 to 20% by mass based on the silica particles.

This polishing composition may comprise, in addition to the silica particles and water soluble polymer, another additive such as a basic compound, a pH adjuster, a surfactant and a chelating agent.

The basic compound promotes polishing and improves the dispersibility of the silica particles. Examples of the basic compound include ammonia, an amine, an alkali metal hydride, an alkali earth metal hydride, an alkali metal hydroxide, an alkali earth metal hydroxide, a quaternary ammonium compound and an amine-based coupling agent. Among the above, ammonia is preferable because it improves the polishing performance such as the smoothness of the substrate. The reason for this has not been clarified, but it is believed that, when a load is applied to the silica particles upon the polishing of the substrate, ammonia adsorbed inside the particles or onto the surface of the particles comes into contact with the substrate and the substrate becomes partially alkaline, making it easier to be polished. Furthermore, ammonia is suitable because it is easy to be cleaned in the polishing and is unlikely to remain on the substrate.

These basic compounds can be used alone or can be used in combination. The content thereof is preferably 0.0001 to 5% by mass based on the total amount of the polishing composition. When the content is greater than 5% by mass, there is a risk that the stability of the polishing composition is reduced. In addition, since the amount of the basic compound adsorbed inside the particles or onto the surface of the particles is too large, the interaction with the additive is unlikely to occur upon processing into the polishing composition, and there is a risk that the polished surface is etched by the excessive basic compound. On the other hand, when the content is smaller than 0.0001% by mass, there is a risk that the polishing effect as mentioned above is not obtained. The content of the basic compound is more preferably 0.001 to 2% by mass based on the total amount of the polishing composition.

[Method for Producing Dispersion Liquid of Silica Particles]

A method for producing a dispersion liquid of silica particles of the present invention will be described.

At first, an alkoxysilane is hydrolyzed and polycondensed to prepare a dispersion liquid containing silica particles, the silica particles having a primary particle diameter based on the specific surface area determined by a BET method using nitrogen adsorption of 5 to 300 nm and a coefficient of variation in the particle diameter (CV value) of 10% or less (a dispersion liquid preparation step). This dispersion liquid is heated at a pH of 7 or higher to adjust a Sears number Y of the silica particles to 10.0 to 12.0 (a particle surface adjustment step). Subsequently, this dispersion liquid is concentrated at a pH of lower than 7 (a concentration step).

According to such a production method, the dispersion liquid having a high concentration of silica particles containing a desired amount of OH groups can be readily produced. In addition, the present production method may also have another step, such as a water replacement step. Note that, unless otherwise noted, the pH is a value at 25° C.

In the following, each step will be described in detail.

[Dispersion Liquid Preparation Step]

Here, an alkoxysilane, which is a raw material, is hydrolyzed and polycondensed in the presence of water, an organic solvent and a catalyst to form silica particles, and a dispersion liquid containing the silica particles is prepared.

The alkoxysilane may be one kind or two or more kinds of the alkoxysilane of the following [formula 3]:

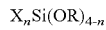 [formula 3]

wherein X represents a hydrogen atom, a fluorine atom, an alkyl group having 1 to 8 carbon atoms, an aryl group, or a vinyl group; R represents a hydrogen atom, an alkyl group having 1 to 8 carbon atoms, an aryl group, or a vinyl group; and n is an integer of 0 to 3.

Here, as the alkoxysilane, those having a short alkyl chain, such as tetramethoxysilane (TMOS) and tetraethoxysilane (TEOS), are preferable. This is because the hydrolysis rate is fast and compaction proceeds easily, and silica particles having a low carbon content tend to be obtained.

Examples of the method for preparing a dispersion liquid of silica particles through hydrolysis of alkoxysilane include the following two methods:
(Method I) a method in which a mixed solution of an alkoxysilane and an organic solvent is added to a bedding solution containing water, an organic solvent and a catalyst; and
(Method II) a method in which a liquid A containing alkoxysilane and a liquid B containing a catalyst and water are added at the same time to a bedding solution consisting substantially of an organic solvent.

Here, the liquid A may contain an organic solvent. Also, the expression "consist(ing) substantially of an organic solvent" means that the inevitably contained impurities or the like derived from the process of producing the organic solvent may be contained but substances other than the impurities or the like are not contained. For example, the organic solvent is 99% by mass or more, and is preferably 99.5% by mass or more. When the liquid A and the liquid B are added at the same time to such a bedding solution, the generation of incompletely reacted materials such as oligomers that have not been grown into the silica particles intended to be produced is suppressed. In particular, by keeping the amounts of water and alkali catalyst, which have a great influence on the hydrolysis of alkoxysilane, to be constant relative to the alkoxysilane during the reaction period, the alkoxysilane which is sequentially added is always hydrolyzed under the same conditions. This suppresses the generation of incompletely reacted materials. That is, it is preferable that the variation rate of the mole ratio of the alkali catalyst to the alkoxysilane in the reaction system during a period from the start to the end of the addition of the liquid A and the liquid B relative to the initial mole ratio is set to 0.90 to 1.10, and that the variation rate of the mole ratio of water to the alkoxysilane in the reaction system during a period from the start to the end of the addition of the liquid A and the liquid B relative to the initial mole ratio is set to 0.90 to 1.10.

Hydrolysis of alkoxysilane is typically carried out under atmospheric pressure and at a temperature of the boiling point of the solvent to be used or lower. Also, when a heat- and pressure-resistant container such as an autoclave is used, the hydrolysis can be carried out at a temperature even higher than this temperature.

Note that, in both methods, the so-called seeding method, in which pre-prepared seed particles are added to the bedding solution, may also be employed.

Examples of the organic solvent include alcohols, ketones, ethers and esters. More specifically, alcohols such as methanol, ethanol, propanol or butanol; ketones such as methyl ethyl ketone or methyl isobutyl ketone; glycol ethers such as methyl cellosolve, ethyl cellosolve or propylene glycol monopropyl ether; glycols such as ethylene glycol, propylene glycol or hexylene glycol; or esters such as methyl acetate, ethyl acetate, methyl lactate or ethyl lactate are used. Among the above, methanol or ethanol is more preferable, and methanol is particularly preferable. These organic solvents may be used alone or may be used as a mixture of two or more kinds.

As for the catalyst, a compound (alkali) that exhibits basic properties, such as ammonia, an amine, an alkali metal hydride, an alkali earth metal hydride, an alkali metal hydroxide, an alkali earth metal hydroxide, a quaternary ammonium compound and an amine-based coupling agent is used. These catalysts can be used alone or can be used in combination. Ammonia is preferable although it depends on, for example, the conditions for use and the amount to be used.

This is because ammonia does not contain any organic groups in its structure, and therefore, upon processing into the polishing composition, the OH groups on the surface of the particles are not covered with organic groups and the interaction between the particle and the additive is not prevented. In addition, ammonia is easy to handle upon production, and excess ammonia can be readily discharged out of the system by heating or the like. As such, it is easy to adjust the amount of ammonia remaining in the dispersion liquid. Furthermore, ammonia is also preferable in that it does not contain any metal element that may affect the insulation properties of the circuit of the polished substrate or the like, like an alkali metal hydride, an alkali earth metal hydride, an alkali metal hydroxide or an alkali earth metal hydroxide.

The amount of the catalyst to be used for hydrolysis is preferably 0.005 to 1 mole per mole of alkoxysilane. When the amount is less than 0.005 moles, hydrolysis is unlikely to occur and there is a risk that the particle size distribution of the particles becomes wider. On the other hand, when the amount is greater than 1 mole, the hydrolysis speed becomes significantly fast, thereby making it difficult to form particles and there is a risk that the alkoxysilane becomes a gel-like substance. It is more preferable the amount of the catalyst to be added is 0.01 to 0.8 moles per mole of alkoxysilane.

The amount of water used for hydrolysis is preferably 0.5 to 10 moles per mole of Si—OR group constituting the alkoxysilane, and more preferably 1 to 5 moles.

The silica particle concentration of the dispersion liquid is preferably less than 10% by mass, more preferably less than 8% by mass, and further preferably less than 5% by mass.

When the hydrolysis is carried out under the conditions as described above, polycondensation of alkoxysilane proceeds in a three dimensional manner. The silica particles obtained in the present step have a primary particle diameter based on the specific surface area of the particles of 5 to 300 nm and a CV value of 10% or less. When the primary particle diameter is less than 5 nm, the stability of the dispersion liquid of silica particles becomes insufficient. In addition, since the primary particle diameter is too small, sufficient polishing speed cannot be obtained when used as a polishing composition. On the contrary, when silica particles in which the primary particle diameter is greater than 300 nm or the CV value is greater than 10% is used as a polishing composition, and it becomes a factor that causes defects on the polished substrate, such as scratches occurring on the polished substrate and that the desired smoothness cannot be obtained.

This primary particle diameter of the silica particles is preferably 5 to 100 nm, more preferably 10 to 80 nm, further preferably 20 to 60 nm, particularly preferably 25 to 45 nm, and most preferably 25 to 35 nm. In addition, the CV value is preferably 8% or less and more preferably 6% or less.

By the way, by hydrolyzing the alkoxysilane again in the presence of the obtained silica particles, larger silica particles or silica particles with a uniform particle diameter distribution can also be obtained.

Note that the above primary particle diameter based on the specific surface area of the silica particles and CV value are almost the same values as the primary particle diameter based on the specific surface area of particles and CV value of the silica particles in the dispersion liquid of silica particles as the final product.

[Particle Surface Adjustment Step]

In the particle surface adjustment step, the dispersion liquid of silica particles formed in the dispersion liquid preparation step is heated at a pH of 7 or higher to adjust the amount of OH groups of the silica particles. Here, the Sears number Y of the silica particles is adjusted to 10.0 to 12.0. In order to adjust the Sears number Y to a desired value, it is preferable to heat the dispersion liquid of silica particles while maintaining this pH for a predetermined time (at least 1 hour or longer). On the other hand, when the dispersion liquid of silica particles is heated at a pH of lower than 7, the amount of OH groups of the silica particles is not likely to change, and thus a desired Sears Y cannot be readily obtained.

When the Sears number Y is less than 10.0, the amount of OH groups present in the particles is small, and when the particles are contained in a polishing composition, the interaction with the water soluble polymer will be small. As such, desired aggregates are not formed. On the contrary, when the Sears number Y is greater than 12.0, the amount of OH groups present in the particles is large, and when the particles are contained in a polishing composition, the interaction with the water soluble polymer will be big. Therefore, aggregates formed are not readily collapsed during polishing, scratches (cracks) occur on the polished substrate, and desired smoothness cannot be obtained. The upper limit of the pH upon heating the dispersion liquid is not particularly limited, but is, for example, about 10.

Note that an alkali may be added before initiation of heating or during heating in order to achieve a predetermined pH. However, if the pH is already at a predetermined pH, it does not need to be added. As the alkali, the catalyst used in the dispersion liquid preparation step mentioned above can be used. As this alkali species, ammonia is preferable in that adjustment of the pH is easy, and it does not contain organic groups that have a risk of modifying the silica particles to decrease the polishing performance or the stability of the dispersion liquid, or metal elements that have a risk of affecting the insulation properties and the like of the circuit of the polished substrate. This pH is preferably 7.5 or higher, and more preferably 8 or higher.

The heating in this step may be carried out at a temperature of or above the boiling point of the dispersion medium under atmospheric pressure or increased pressure. However, it is preferable to heat the dispersion medium such that it does not boil. This is because, by heating the dispersion medium under conditions where it does not boil, the occurrence of microgels is suppressed, which in turn enables improvement in filterability and suppression of the occurrence of defects in the polished substrate. For example, the heating can be carried out at a temperature below the boiling point of the dispersion medium under atmospheric pressure or increased pressure. Specifically, heating at lower than 100° C. under atmospheric pressure is preferable, and heating at 90 to 96° C. is more preferable.

In addition, the present step may be carried out in a closed system or in an open system. When the present step is carried out in the closed system, it can prevent the alkali from being discharged out of the system and allows adjustment of OH groups while maintaining the pH in the system. On the other hand, if the present step is carried out in the open system, when ammonia, amine or the like is used as the alkali, the alkali is also discharged out of the system as the solvent is evaporated by heating. For this reason, it is preferable that the present step is carried out in the closed system where the pH is readily maintained and the OH groups can be adjusted more precisely.

[Concentration Step]

In the concentration step, the dispersion liquid obtained in the particle surface adjustment step is concentrated at a pH of lower than 7. The lower limit thereof is about 6.0. In the present step, the concentration is carried out such that the amount of OH groups that has been adjusted in the particle surface adjustment step is not changed. Note that the present concentration step is carried out after the particle surface adjustment step. However, a preliminary concentration step may be provided at an appropriate stage prior to the particle surface adjustment (for example, before the water replacement step). Note that the adjustment of pH may be carried out by, in addition to alkali distillation by heating, ion exchange, ultrafiltration film treatment or the like, or may be carried out in combination. This pH is preferably 6.9 or lower, and more preferably 6.7 or lower.

The method of concentration is not particularly limited as long as the method can increase the silica concentration of the dispersion liquid. Examples thereof include a heating concentration method, a vacuum concentration method and a membrane concentration method. Among the above, the heating concentration method is preferable because it can be carried out continuously from the previous step. This method is a method in which, for example, while adding the dispersion liquid of silica particles as necessary, the dispersion liquid is heated to evaporate the organic solvent and water, thereby performing concentration.

In the heating concentration method, the Sears number Y (the amount of OH groups) of the silica particles is readily changed when the pH is 7 or higher. Therefore, it is important to control the pH within the range described above. Further, the heating may be carried out under conditions where the dispersion medium of the dispersion liquid boils, but it is preferable that the heating is carried out under conditions where the dispersion medium does not boil. This is because, by heating the dispersion medium under conditions where it does not boil, the occurrence of microgels is suppressed, which in turn enables improvement in filterability and suppression of the occurrence of defects in the polished substrate. That is, it is preferable that the heating is carried out at a temperature below the boiling point of the dispersion medium under atmospheric pressure or increased pressure. Specifically, when the dispersion medium is water, heating at lower than 100° C. under atmospheric pressure is preferable, and heating at 90 to 96° C. is more preferable.

By the way, in the particle surface adjustment step, the viscosity (in terms of a silica concentration of 20% by mass) of the dispersion liquid obtained in the dispersion liquid preparation step once rises to, for example, 60 mPa·s or more. However, over the course from the particle surface adjustment step to the concentration step, by lowering the pH of the dispersion liquid to lower than 7, the viscosity can be reduced. As such, in the dispersion liquid whose viscosity has undergone a temporary rise to 60 mPa·s or more and a subsequent decline, the particles tend to be compact and the dispersion liquid tend to contain no incompletely reacted materials, perhaps because the surface of the particles interacts with each other during the process of viscosity change, thereby advancing the compaction. Thus, by going through the particle surface adjustment step and the concentration step, the "compound containing silicon" (incompletely reacted materials) can be reduced to 200 ppm or less.

Furthermore, the silica particles that have undergone the particle surface adjustment step and the concentration step are characterized by a narrower pore distribution and a smaller pore volume compared to particles that have not undergone these steps. Accordingly, in a polishing composition for which these silica particles are used, the water soluble polymer does not penetrate inside the particles and stays on the surface of the particles, and therefore, high polishing speed and a good polished surface are easy to be obtained.

[Water Replacement Step]

In the water replacement step, the organic solvent in the dispersion liquid of silica particles is replaced with water (pure water). The present step can be performed at any appropriate stage after the dispersion liquid preparation step. Above all, it is preferable to perform the water replacement step before the particle surface adjustment step.

The method of water replacement is not particularly limited as long as the organic solvent can be replaced with water (pure water). Examples of this method include a heating replacement method, a vacuum replacement method and a membrane replacement method. Among the above, the heating replacement method is preferable because the particle surface adjustment step can be carried out continuously after this step. This method is, for example, a method in which the dispersion liquid is heated to evaporate the organic solvent while adding water, thereby keeping the liquid volume constant and replacing the organic solvent with water. It is operationally preferable that this step is carried out at atmospheric pressure. Note that it is also possible to perform concentration at the same time without keeping the liquid volume constant.

When heated at atmospheric pressure, the water replacement can also be completed at a time point where the liquid temperature substantially reaches the boiling point of water (100° C.). However, in order to prevent the occurrence of microgels or the like, it is preferable to control the temperature such that the temperature does not reach 100° C. (the dispersion liquid does not boil). This method is completed at a time point where the dispersion liquid has been heated for a predetermined time while maintaining the temperature at, for example, about 90 to 96° C.

The dispersion liquid of silica particles produced by the production method mentioned above and the silica particles contained therein satisfy the requirements for the silica particles in the dispersion liquid mentioned above.

EXAMPLES

Hereinafter, Examples of the present invention will be specifically described.

<Dispersion Liquid of Silica Particles>

Synthesis Example 1

(Dispersion Liquid Preparation Step)

A raw material solution was prepared by mixing 540.0 g of tetramethoxysilane (manufactured by Tama Chemicals Co., Ltd. (the same applies hereinafter)) and 180.0 g of methanol. In a reaction tank, 5,400 g of a solvent to which methanol, water and ammonia were mixed in advance, was charged. The concentration of water and ammonia in this mixed solvent was 15% by mass and 1% by mass, respectively. While controlling the liquid temperature such that the temperature of the reaction solvent can be maintained at 20° C., the raw material solution was added dropwise to the reaction tank at an even speed over 25 minutes, thereby obtaining a dispersion liquid of silica particles with a silica particle concentration of 3.5% by mass.

(Preliminary Concentration Step)

The dispersion liquid (silica particle concentration of 3.5% by mass) obtained in the dispersion liquid preparation step was concentrated by a heating concentration method. Specifically, while heating the dispersion liquid obtained in the dispersion liquid preparation step at atmospheric pressure to evaporate the organic solvent and water, a dispersion liquid of silica particles (silica concentration of 3.5% by mass) prepared in advance was added such that the liquid volume was kept constant, thereby concentrating the dispersion liquid.

(Water Replacement Step)

While adding water to the concentrated dispersion liquid, water replacement was carried out at atmospheric pressure by a heating replacement method. At a time point where the liquid temperature reached 96° C., the water replacement step was stopped.

(Particle Surface Adjustment Step)

After the water replacement step was completed, the heating treatment was carried out at a pH of 7 or higher while keeping the liquid temperature at 96° C. under atmospheric pressure. In this step as well, the same amount of water as the amount of liquid to be distilled was added, and the heating was continued for 30 hours while keeping the silica concentration in the system constant, and the Sears number of the silica particles was adjusted to the target value.

(Concentration Step)

Confirming that the pH was below 7, the addition of water was stopped and concentration was carried out under atmospheric pressure and 96° C. until the silica particle concentration reached 20% by mass, thereby preparing a dispersion liquid A of silica particles.

Table 1 shows the pH of the dispersion liquid at the start of the particle surface adjustment step; and the concentration of silica particles in the dispersion liquid at the end of the concentration step, the pH, the Sears number Y, the specific surface area (SA) of silica particles, the particle density, the viscosity, the filterability, the amount of incompletely reacted materials, the primary particle diameter (calculated from SA), the average particle diameter (short diameter average from SEM image analysis), the coefficient of variation in the particle diameter (CV value), and the content rate of linked particles in which two silica particles are linked (the same applies for the following Synthesis Examples and Synthesis Comparative Examples). Note that various parameters were measured by the following methods.

<<Concentration of Silica Particles in Dispersion Liquid>>

5 g of the sample was dried at 150° C. for 1 hour, and the solid concentration was calculated from the mass after drying. From the value obtained by subtracting the metal element content of silica particles in terms of the oxide and the amount of incompletely reacted materials, which will be mentioned later, from the above solid concentration, the concentration of silica particles was calculated.

<<Sears Number Y of Silica Particles>>

The Sears number Y was measured by titration using sodium hydroxide in accordance with the description in Sears, Analytical Chemistry 28 (1956), 12, 1981-1983.

Specifically, to 150 g of a solution of silica particles diluted with pure water such that the concentration of silica particles was 1% by mass, 30 g of sodium chloride was added. After adjusting the pH to 4.0 with hydrochloric acid, the solution was titrated with a 0.1 N aqueous sodium hydroxide solution and the Sears number Y was expressed as the amount required to reach a pH of 9.0 (that is, the titration amount of a 0.1 N aqueous sodium hydroxide solution for a silica amount of 1.5 g). Note that the titration with a 0.1 N aqueous sodium hydroxide solution was carried out using an automatic titration apparatus, fixing the titration rate to 0.1 ml/sec.

<<Specific Surface Area of Silica Particles>>

The specific surface area (SA) was measured with a specific surface area measuring apparatus (Macsorb-1200 manufactured by MOUNTECH Co., Ltd.) according to a BET method using nitrogen adsorption. Note that, as a sample for measurement, the dispersion liquid of silica particles was dried at 105° C. to be used in form of powder.

<<Density of Silica Particles>>

The density ($T_D$) of the silica particles was determined by a liquid phase substitution method (pycnometer method) according to the following [formula 4]. Note that the measurement was carried out in accordance with JIS Z 8807 "Methods of measuring density and specific gravity of solid".

$$T_D = (W2-W1)/[V-(W3-W2)/\rho e]  \quad\quad \text{[formula 4]}$$

Here, W1 is the mass of the specific gravity bottle capped with the stopper; W2 is the mass of the specific gravity bottle having the sample placed therein, and capped with the stopper; W3 is the mass of the specific gravity bottle having the sample placed therein, filled with ethanol, and capped with the stopper; V is the volume of ethanol when the specific gravity bottle is filled with ethanol alone and capped with the stopper; and $\rho e$ is the density of ethanol at that temperature.

Hereinafter, the method for measuring the density of silica particles will be specifically described.

<Preparation of Sample>

The dispersion liquid of silica particles was placed in a melting pot, and dried on a hot plate at 150° C. After drying, the dispersion liquid was further heated at 300° C. for 1 hour, and cooled in a desiccator in order to prevent moisture absorption. Then, the silica particles were taken out from the desiccator and crushed in a mortar. About 10 g of the crushed sample was subjected to the measurement.

<Measurement of Sample>

The 25 ml specific gravity bottle and its stopper was washed with ethanol, and dried. This specific gravity bottle was capped with the stopper and weighed with a balance, and its mass was defined as W1. Next, the sample prepared as described above was placed in the specific gravity bottle, which was then capped with the stopper and weighed with the balance, and its mass was defined as W2. 20 ml of ethanol was placed in the specific gravity bottle having the sample placed therein, and deaeration was performed at 0.02 MPa or less for 30 minutes. After the deaeration, the specific gravity bottle was filled with ethanol, and placed in a thermostat bath at 25° C. without the stopper for 30 minutes. Next, the specific gravity bottle was taken out from the thermostat bath, capped with the stopper, and the overflowing ethanol was wiped off. Then, the specific gravity bottle was weighed with the balance, and its mass was defined as W3.

The specific gravity bottle was filled with ethanol alone, and the liquid temperature was measured. Next, the specific gravity bottle was capped with the stopper, and the overflowing ethanol was wiped off. Then, the specific gravity bottle was weighed with the balance, and the volume (V) of the specific gravity bottle was determined from the density $\rho e$ (literature value) of ethanol at that temperature.

The obtained values were substituted into the above formula [4], thereby determining the density ($T_D$) of the silica particles.

Evaluation of the particle density (compaction degree) was carried out according to the following criteria.

<<Evaluation for Particle Density (Compaction Degree)>>

○: 1.80 g/cm$^3$ or more
Δ: 1.70 g/cm$^3$ or more and less than 1.80 g/cm$^3$
x: less than 1.70 g/cm$^3$ <<Viscosity of Dispersion Liquid>>

The measurement was conducted using a rheometer (RS3000 manufactured by HAAKE) under conditions with a temperature of 25° C. and a shear rate of 100 s$^{-1}$. Note that the viscosity in terms of a silica concentration of 20% by mass refers to a viscosity measured by, without changing the pH of the dispersion liquid of silica particles with a certain silica concentration, adjusting its silica particle concentration to 20% by mass.

Evaluation of the viscosity was carried out according to the following criteria.

<<Evaluation for Viscosity>>

○: 30 mPa·s or less
Δ: greater than 30 mPa·s and 40 mPa·s or less
x: greater than 40 mPa·s <<Filterability of Dispersion Liquid>>

The filterability was determined by attaching a filter (DISMIC-25HP045AN) manufactured by Advantec Toyo Kaisha, Ltd. to the end of a 50 ml syringe, filtering the dispersion liquid through the filter with a load of 3.5 kg, and measuring the volume of the liquid passing.

Evaluation of the filterability was carried out according to the following criteria.

<<Evaluation for Filterability>>

○: 30 g or more
Δ: 25 g or more and less than 30 g
x: less than 25 g

<<Metal Element Content of Silica Particles>>

For the contents of alkali metals, alkali earth metals, Fe, Ti, Zn, Pd, Ag, Mn, Co, Mo, Sn, Al and Zr, the contents of Cu, Ni and Cr, and the contents of U and Th in the silica particles, the silica particles were dissolved in hydrofluoric acid, the resultant solution was heated to remove hydrofluoric acid, pure water was then added as necessary, and the obtained solution was measured by using an ICP-MS inductively coupled plasma mass spectrometer (7900s manufactured by Agilent Technologies).

<<Amount of Incompletely Reacted Materials in Dispersion Liquid>>

Using a micro ultracentrifuge (CS150GXL manufactured by Hitachi Koki Co., Ltd.), the dispersion liquid was centrifuged at 1,370,000 rpm (1,000,000 G) for 30 minutes at a set temperature of 10° C. "Compounds containing silicon" (incompletely reacted materials) other than the silica particles present in the supernatant of this treated solution were measured as Si with an ICP emission spectrometer (ICPS- 8100 manufactured by Shimadzu Corporation). This measured value was converted into the concentration of $SiO_2$ in the dispersion liquid.

<<Primary Particle Diameter of Silica Particles>>

The primary particle diameter (d) based on the specific surface area (SA) of the silica particles is determined according to the following formula [5], defining the particle density ($\rho$) as 2.20 g/cm$^3$.

Note that the specific surface area is determined by a BET method using nitrogen adsorption, as mentioned above.

$$d = 6000/(\rho \cdot SA) = 2727/SA \, [\text{nm}] \quad [5]$$

<<Average Particle Diameter of Silica Particles (SEM Image Analysis)>>

An electron micrograph of silica particles was taken, and the short diameter was determined for each of 100 arbitrary particles. In detail, a rectangle enclosing each particle with a minimum area was determined, and the length of the shorter side was defined as the short diameter of the particle. The average value thereof was defined as the average particle diameter ($D_x$) of the silica particles.

<<Coefficient of Variation in Particle Diameter of Silica Particles>>

The following formula was used for the determination. Note that, for determining the coefficient of variation in the particle diameter (CV value), the individual particle diameter and average particle diameter determined from the electron micrograph described above were used.

$$CV \text{ value} = (\text{Standard variation of particle diameter } (\sigma)/\text{Average particle diameter } (D_x)) \times 100$$

$$\text{Standard variation of particle diameter } (\sigma) = \sqrt{\frac{\sum (D_i - D_x)^2}{n-1}}$$

$D_i$: Particle diameter of individual particle, $n$: 100

<<Sphericity of Primary Particles of Silica Particles>>

An electron micrograph was taken, and for each of 100 arbitrary particles, the average value of the ratio ($D_S/D_L$) between the maximum diameter ($D_L$) and the short diameter ($D_S$) orthogonal thereto was determined and defined as the sphericity. Note that the sphericity was calculated using particles that are not linked.

<<Proportion of Linked Particles>>

An electron micrograph of the silica particles was taken, and for 100 arbitrary particles, the presence or absence of linkage was confirmed. Then, the particles were divided into those not linked, those in which two silica particles were linked, and those in which three or more silica particles were linked. The number of each category was counted, and the proportion of those in which two silica particles were linked relative to the entire number of particles was calculated.

Synthesis Example 2

In the same manner as in Synthesis Example 1 except that the heating time in the particle surface adjustment step was set to 37 hours, a dispersion liquid B of silica particles was prepared.

Synthesis Example 3

In the same manner as in Synthesis Example 1 except that the heating time in the particle surface adjustment step was set to 12 hours, a dispersion liquid C of silica particles was prepared.

Synthesis Example 4

In the same manner as in Synthesis Example 1 except that the liquid temperature at the end of the water replacement step was set to 100° C. under atmospheric pressure, a dispersion liquid D of silica particles was prepared.

Synthesis Example 5

In the same manner as in Synthesis Example 1 except that the liquid temperature was adjusted in the dispersion liquid preparation step such that the liquid temperature of the reaction solvent could be maintained at 15° C., a dispersion liquid E of silica particles was prepared.

Synthesis Example 6

In the same manner as in Synthesis Example 1 except that the liquid temperature was adjusted in the dispersion liquid preparation step such that the liquid temperature of the reaction solvent could be maintained at 25° C., a dispersion liquid F of silica particles was prepared.

Note that, in any of Synthesis Examples, the contents of alkali metals, alkali earth metals, Fe, Ti, Zn, Pd, Ag, Mn, Co, Mo, Sn, Al and Zr were each less than 0.1 ppm in silica particles; the contents of Cu, Ni and Cr were each less than 1 ppb; and the contents of U and Th were each less than 0.3 ppb. In addition, the sphericity of primary particles of the silica particles was 0.80 to 1.00.

Synthesis Comparative Example 1

In the same manner as in Synthesis Example 1 except that neither particle surface adjustment step nor concentration step was carried out, a dispersion liquid G of silica particles was obtained.

Synthesis Comparative Example 2

In the same manner as in Synthesis Example 4 except that neither particle surface adjustment step nor concentration step was carried out, a dispersion liquid H of silica particles was obtained.

Synthesis Comparative Example 3

In the same manner as in Synthesis Example 4 except that, after the end of the particle surface adjustment step, the pH was set to 7 or higher (pH of 7.5 to 8.0) by adding aqueous ammonia in the concentration step, a dispersion liquid I of silica particles was obtained.

Synthesis Comparative Example 4

In the same manner as in Synthesis Example 1 except that the heating time in the particle surface adjustment step was set to 60 hours, a dispersion liquid J of silica particles was prepared.

Synthesis Comparative Example 5

In the same manner as in Synthesis Example 1 except that the heating time in the particle surface adjustment step was set to 0.5 hours, a dispersion liquid K of silica particles was prepared.

Synthesis Comparative Example 6

In the same manner as in Synthesis Example 6 except that the raw material solution was added dropwise to the reaction tank over 20 minutes, a dispersion liquid L of silica particles was prepared.

Note that, in any of Synthesis Comparative Examples, the contents of alkali metals, alkali earth metals, Fe, Ti, Zn, Pd, Ag, Mn, Co, Mo, Sn, Al and Zr were each less than 0.1 ppm in silica particles; the contents of Cu, Ni and Cr were each less than 1 ppb; and the contents of U and Th were each less than 0.3 ppb. In addition, the sphericity of primary particles of the silica particles was 0.80 to 1.00.

<Polishing Composition>

Example 1

The dispersion liquid A of silica particles and a water soluble polymer a (hydroxyethyl cellulose (molecular weight 350000)) were mixed in the ratio shown in Table 2, thereby preparing a polishing composition A-1 with a silica particle concentration of 0.45% by mass. Note that, in the polishing composition, 0.02% by mass of ammonia was contained.

Example 2

In the same manner as in Example 1 except that the dispersion liquid B of silica particles was used, a polishing composition B was prepared.

Example 3

In the same manner as in Example 1 except that the dispersion liquid C of silica particles was used, a polishing composition C was prepared.

Example 4

In the same manner as in Example 1 except that the dispersion liquid D of silica particles was used, a polishing composition D was prepared.

Example 5

In the same manner as in Example 1 except that a water soluble polymer b (polyvinyl alcohol (molecular weight 80000)) was used, a polishing composition A-2 was prepared.

Example 6

In the same manner as in Example 1 except that the compounding ratio of the water soluble polymer a was changed, a polishing composition A-3 was prepared.

Example 7

In the same manner as in Example 1 except that the compounding ratio of the water soluble polymer a was changed, a polishing composition A-4 was prepared.

Example 8

In the same manner as in Example 1 except that the dispersion liquid E of silica particles was used, a polishing composition E was prepared.

Example 9

In the same manner as in Example 1 except that the dispersion liquid F of silica particles was used, a polishing composition F was prepared.

Comparative Example 1

In the same manner as in Example 1 except that the dispersion liquid G of silica particles was used, a polishing composition G was prepared.

Comparative Example 2

In the same manner as in Example 1 except that the dispersion liquid H of silica particles was used, a polishing composition H was prepared.

Comparative Example 3

In the same manner as in Example 1 except that the dispersion liquid I of silica particles was used, a polishing composition I was prepared.

Comparative Example 4

In the same manner as in Example 1 except that the dispersion liquid J of silica particles was used, a polishing composition J was prepared.

Comparative Example 5

In the same manner as in Example 1 except that the dispersion liquid K of silica particles was used, a polishing composition K was prepared.

Comparative Example 6

In the same manner as in Example 1 except that the dispersion liquid L of silica particles was used, a polishing composition L was prepared.

Comparative Example 7

In the same manner as in Example 1 except that the water soluble polymer a was not contained, a polishing composition M was prepared.

Table 2 shows the composition, pH, average aggregated particle diameter, evaluation for polishing properties (polishing speed, smoothness and defects) of the polishing compositions. Note that each measurement value was determined by the following methods.

<<Average Aggregated Particle Diameter>>

The measurement was carried out by a dynamic light scattering method using Zetasizer Nano ZS manufactured by Malvern Panalytical Ltd. The Z-average value obtained by the measurement was defined as the average particle diameter (average aggregated particle diameter) of the silica particles in the polishing composition. When the silica concentration of the polishing composition was higher than 0.5% by mass, it was diluted with aqueous ammonia to 0.5% by mass such that the pH was not changed, and the measurement sample was subjected to the measurement. However, when the silica concentration was lower than 0.5% by mass, the measurement sample was subjected to the measurement as it was.

<Evaluation for Polishing Composition>
1. Polishing Speed

A substrate for polishing (a single crystal silicon wafer having a crystal structure of 1.0.0) was used and set in a polishing machine (NF300 manufactured by Nano Factor Co., Ltd.), and the substrate for polishing was polished for 5 minutes by use of a polishing pad Politex P103 with a polishing load of 0.05 MPa at a table rotation speed of 50 rpm, and a spindle speed of 50 rpm with each of the polishing compositions (A to M) described above at a speed of 100 ml/min. Thereafter, the substrate was washed with pure water and air-dried. The polishing speed for this substrate was evaluated according to the following criteria.

<<Evaluation for Polishing Speed>>

○: greater than 25 nm/min

Δ: 20 to 25 nm/min x: less than 20 nm/min

2. State of Polished Surface

In the obtained polished surface of the polished substrate, the waviness at a wavelength of 50 to 500 μm was observed using a scanning white light interferometer (Zygo New View 7300), and the smoothness of the surface was evaluated in accordance with the following criteria (waviness).

<<Evaluation for Smoothness>>

○: waviness of less than 0.5 nm

Δ: waviness of 0.5 nm or more and less than 1.0 nm x: waviness of 1.0 nm or more By using a laser microscope (VK-X250 manufactured by KEYENCE CORPORATION), the degree of defects such as scratches occurring on the polished substrate was confirmed, thereby evaluating the defects in accordance with the following criteria.

<<Evaluation for Defects>>

○: almost no defects observed

Δ: a few defects observed x: defects observed over a wide area

TABLE 1

| | | Synthesis Example 1 | Synthesis Example 2 | Synthesis Example 3 | Synthesis Example 4 | Synthesis Example 5 | Synthesis Example 6 | Synthesis Comparative Example 1 | Synthesis Comparative Example 2 | Synthesis Comparative Example 3 | Synthesis Comparative Example 4 | Synthesis Comparative Example 5 | Synthesis Comparative Example 6 |
|---|---|---|---|---|---|---|---|---|---|---|---|---|---|
| Name of dispersion liquid of silica particles | | A | B | C | D | E | F | G | H | I | J | K | L |
| Steps | Dispersion liquid preparation | Dropwise addition, 25 min, 20° C. | ↓ | ↓ | ↓ | Dropwise addition, 25 min, 15° C. | Dropwise addition, 25 min, 25° C. | Dropwise addition, 25 min, 20° C. | ↓ | ↓ | ↓ | ↓ | Dropwise addition, 20 min, 25° C. |
| | Preliminary concentration/Water replacement | To 96° C. (at atmospheric pressure) | ↓ | ↓ | To 100° C. (at atmospheric pressure) | To 96 °C. (at atmospheric pressure) | ↓ | To 96° C. (at atmospheric pressure) | To 100° C. (at atmospheric pressure) | ↓ | To 96° C. (at atmospheric pressure) | ↓ | To 96° C. (at atmospheric pressure) |
| | Particle surface adjustment | 96° C. (at atmospheric pressure) 30 hr. | 96° C. (at atmospheric pressure) 37 hr. | 96° C. (at atmospheric pressure) 12 hr. | 96° C. (at atmospheric pressure) 30 hr. | ↓ | ↓ | None | None | 96° C. (at atmospheric pressure) 30 hr. pH ≥7 | 96° C. (at atmospheric pressure) 60 hr. pH <7 | 96° C. (at atmospheric pressure) 0.5 hr. | 96° C. (at atmospheric pressure) 30 hr. |
| | Concentration (concentration to silica particle concentration of 20% by mass) | 96° C. (at atmospheric pressure) pH <7 | ↓ | ↓ | ↓ | ↓ | ↓ | None | None | | | | |
| Physical properties of step product | pH at the start of particle surface adjustment step | 8.3 | 8.3 | 8.3 | 8.1 | 8.0 | 8.7 | 8.3 | 8.1 | 8.1 | 8.3 | 8.3 | 8.7 |
| Physical properties of dispersion liquid of silica particles | Concentration of silica particles (% by mass) | 20 | 20 | 20 | 20 | 20 | 20 | 15 | 15 | 20 | 20 | 20 | 20 |
| | pH | 6.2 | 6.2 | 6.3 | 6.2 | 6.2 | 6.4 | 8.3 | 8.1 | 7.5 | 6.2 | 6.3 | 6.2 |
| | Sears number Y (ml/1.5 g of silica) | 11.0 | 10.5 | 11.5 | 11.0 | 10.0 | 10.0 | 13.4 | 13.3 | 8.5 | 9.0 | 13.0 | 10.0 |
| | Specific surface (m²/g) | 79 | 79 | 80 | 78 | 61 | 109 | 95 | 88 | 80 | 79 | 80 | 109 |
| | Density of particles (g/cm³) | ○ | ○ | ○ | ○ | ○ | ○ | × | △ | ○ | ○ | ○ | ○ |
| | Viscosity (@ 20% by mass) | ○ | ○ | ○ | ○ | ○ | ○ | × | × | × | ○ | ○ | ○ |
| | Filterability | ○ | ○ | ○ | △ | ○ | ○ | ○ | △ | × | ○ | ○ | ○ |
| | Amount of incompletely reacted materials (ppm) | 150 | 150 | 150 | 140 | 150 | 160 | 220 | 220 | 160 | 140 | 160 | 160 |
| | Primary particle diameter (calculated from SA) (nm) | 35 | 35 | 34 | 35 | 45 | 25 | 29 | 31 | 34 | 35 | 34 | 25 |
| | Average particle (nm) | 50 | 50 | 50 | 50 | 65 | 30 | 50 | 50 | 50 | 50 | 50 | 30 |

TABLE 1-continued

|  |  | Synthesis Example 1 | Synthesis Example 2 | Synthesis Example 3 | Synthesis Example 4 | Synthesis Example 5 | Synthesis Example 6 | Synthesis Comparative Example 1 | Synthesis Comparative Example 2 | Synthesis Comparative Example 3 | Synthesis Comparative Example 4 | Synthesis Comparative Example 5 | Synthesis Comparative Example 6 |
|---|---|---|---|---|---|---|---|---|---|---|---|---|---|
| diameter (short diameter average from SEM image analysis) | | | | | | | | | | | | | |
| Coefficient of variation in the particle diameter (CV value) | % | 6 | 6 | 6 | 6 | 8 | 10 | 6 | 6 | 6 | 6 | 6 | 11 |
| Content rate of linked particles | % | 25 | 25 | 25 | 25 | 22 | 30 | 25 | 25 | 25 | 25 | 25 | 35 |

TABLE 2

|  | Example 1 | Example 2 | Example 3 | Example 4 | Example 5 | Example 6 | Example 7 | Example 8 | Example 9 |
|---|---|---|---|---|---|---|---|---|---|
| Name of polishing composition | A-1 | B | C | D | A-2 | A-3 | A-4 | E | F |
| Name of dispersion liquid of silica particles | A | B | C | D | A | A | A | E | F |
| Type of water soluble polymer | a | a | a | a | b | More a | Less a | a | a |
| Content of water soluble polymer (relative to silica. % by mass) | 2 | 2 | 2 | 2 | 70 | 5 | 1 | 2 | 2 |
| pH | 10.1 | 10.1 | 10.1 | 10.1 | 10.1 | 10.1 | 10.1 | 10.1 | 10.1 |
| Average aggregated particle diameter (nm) | 82 | 81 | 83 | 82 | 82 | 84 | 80 | 110 | 65 |
| Polishing properties — Polishing speed | ○ | ○ | ○ | ○ | ○ | Δ | ○ | ○ | ○ |
| Polishing properties — Surface cuality (smoothness) | ○ | ○ | ○ | ○ | ○ | ○ | Δ | ○ | ○ |
| Polishing properties — Defects | ○ | ○ | ○ | Δ | ○ | ○ | ○ | ○ | ○ |
| Concentration in polishing composition (% by mass) — Silica particles | 0.45 | 0.45 | 0.45 | 0.45 | 0.45 | 0.45 | 0.45 | 0.45 | 0.45 |
| Concentration in polishing composition (% by mass) — Water soluble polymer | 0.009 | 0.009 | 0.009 | 0.009 | 0.315 | 0.0225 | 0.0045 | 0.009 | 0.009 |

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Name of polishing composition | G | H | I | J | K | L | M |
| Name of dispersion liquid of silica particles | G | H | I | J | K | L | A |
| Type of water soluble polymer | a | a | a | a | a | a | None |
| Content of water soluble polymer (relative to silica. % by mass) | 2 | 2 | 2 | 2 | 2 | 2 | 0 |
| pH | 10.1 | 10.1 | 10.1 | 10.1 | 10.1 | 10.1 | 10.1 |
| Average aggregated particle diameter (nm) | 90 | 87 | 78 | 79 | 87 | 65 | 66 |
| Polishing properties — Polishing speed | ○ | ○ | x | x | ○ | ○ | x |
| Polishing properties — Surface cuality (smoothness) | x | x | ○ | ○ | x | x | x |
| Polishing properties — Defects | x | x | ○ | ○ | x | x | x |
| Concentration in polishing composition (% by mass) — Silica particles | 0.45 | 0.45 | 0.45 | 0.45 | 0.45 | 0.45 | 0.45 |
| Concentration in polishing composition (% by mass) — Water soluble polymer | 0.009 | 0.009 | 0.009 | 0.009 | 0.009 | 0.009 | 0 |

Next, for the above Synthesis Examples 1 to 6 and Synthesis Comparative Examples 1 to 6, the Sears number y calculated for one particle was determined by the [formula 1] mentioned above. In addition, evaluation for whether the obtained Sears number y was within the range of $y = (2.92 \times 10^{-17} \times d - 6.60 \times 10^{-16}) \pm 5 \times 10^{-17}$ (d: primary particle diameter based on the specific surface area) was carried out.

The results are shown in Table 3 and FIG. 1.

TABLE 3

|  | SA (m$^2$/g) | Primary particle diameter d (nm) | Sears number Y (ml/1.5 g SiO$_2$) | Sears number y (ml/particle) | Lower limit of formula range (ml/particle) | Upper limit of formula range (ml/particle) | Evaluation | Remarks |
|---|---|---|---|---|---|---|---|---|
| Synthesis Example 1 | 79 | 34.5 | 11.0 | 3.47E−16 | 2.98E−16 | 3.98E−16 | ○ | |
| Synthesis Example 2 | 79 | 34.5 | 10.5 | 3.32E−16 | 2.98E−16 | 3.98E−18 | ○ | |
| Synthesis Example 3 | 80 | 34.1 | 11.5 | 3.50E−16 | 2.85E−16 | 3.85E−16 | ○ | |
| Synthesis Example 4 | 78 | 35.0 | 11.0 | 3.61E−16 | 3.11E−16 | 4.11E−16 | ○ | |
| Synthesis Example 5 | 61 | 44.7 | 10.0 | 6.86E−16 | 6.04E−16 | 7.04E−16 | ○ | |
| Synthesis Example 6 | 109 | 25.0 | 10.0 | 1.20E−16 | 2.00E−17 | 1.20E−16 | ○ | |
| Synthesis Comparative Example 1 | 95 | 28.7 | 13.4 | 2.43E−16 | 1.28E−16 | 2.28E−16 | x | Above the upper limit |
| Synthesis Comparative Example 2 | 88 | 31.0 | 13.3 | 3.04E−16 | 1.95E−16 | 2.95E−16 | x | Above the upper limit |
| Synthesis | 80 | 34.1 | 8.5 | 2.59E−16 | 2.85E−16 | 3.85E−16 | x | Below the |

TABLE 3-continued

| | SA (m²/g) | Primary particle diameter d (nm) | Sears number Y (ml/1.5 g SiO₂) | Sears number y (ml/particle) | Lower limit of formula range (ml/particle) | Upper limit of formula range (ml/particle) | Evaluation | Remarks |
|---|---|---|---|---|---|---|---|---|
| Comparative Example 3 | | | | | | | | lower limit |
| Synthesis Comparative Example 4 | 79 | 34.5 | 9.0 | 2.84E−16 | 2.98E−16 | 3.95E−18 | x | Below the lower limit |
| Synthesis Comparative Example 5 | 80 | 34.1 | 13.0 | 3.95E−16 | 2.85E−16 | 3.85E−16 | x | Above the upper limit |
| Synthesis Comparative Example 6 | 109 | 25.0 | 10.0 | 1.20E−16 | 2.00E−17 | 1.20E−16 | ○ | |

The invention claimed is:

1. A dispersion liquid of silica particles, containing silica particles satisfying the following requirements (a) to (d):
   (a) a primary particle diameter calculated based on a specific surface area determined by a BET method using nitrogen adsorption is 5 to 300 nm;
   (b) a coefficient of variation in a particle diameter is 10% or less;
   (c) a Sears number Y [ml/SiO₂ 1.5 g] is 10.0 to 12.0, wherein the Sears number Y is a titration amount of a 0.1 N aqueous NaOH solution necessary to reach pH 9.0 for a solution prepared by adding 30 g of sodium chloride to 150 g of dispersion liquid of 1% by mass of silica particles, and adjusting to pH 4.0 with hydrochloric acid; and
   (d) particles in which two silica particles are linked are contained in an amount of 10% or more of a total number of the silica particles.

2. The dispersion liquid of silica particles according to claim 1, wherein the silica particles have a Sears number y [ml/particle] calculated for one particle in a range of $$(2.92\times10^{-17}\times d - 7.10\times10^{-16}) \leq y \leq (2.92\times10^{-17}\times d - 6.10\times10^{-16})$$

wherein:
   d is a primary particle diameter [nm] calculated based on a specific surface area (SA [m²/g]) determined by a BET method using nitrogen) adsorption, and
   y is the Sears number calculated for one particle obtained by the following formula:

$$y = Y\times(2.20\times\Pi d^3)/(1.5\times6)\times10^{-21}.$$

3. The dispersion liquid of silica particles according to claim 1, wherein the silica particles have a density by a pycnometer method of 1.80 g/cm³ or more.

4. The dispersion liquid of silica particles according to claim 1, wherein the particles in which two silica particles are linked are contained in an amount of 20% or more of the total number of the silica particles.

* * * * *